(12) United States Patent
Cao

(10) Patent No.: US 6,535,542 B1
(45) Date of Patent: Mar. 18, 2003

(54) MULTI-WAVELENGTH LASER LIGHT SOURCE

(75) Inventor: Simon X. F. Cao, Fremont, CA (US)

(73) Assignee: Avanex Corporation, Fremont, CA (US)

(*) Notice: Subject to any disclaimer, the term of this patent is extended or adjusted under 35 U.S.C. 154(b) by 255 days.

(21) Appl. No.: 09/619,721

(22) Filed: Jul. 20, 2000

(51) Int. Cl.[7] ............................................... H01S 5/10

(52) U.S. Cl. ..................................... 372/98; 372/106

(58) Field of Search ........................ 372/92, 98, 101, 372/106, 108

(56) References Cited

U.S. PATENT DOCUMENTS

| 4,642,804 A | 2/1987 | Personick | 378/3 |
| 4,839,884 A | 6/1989 | Schloss | 370/3 |
| 5,221,983 A | 6/1993 | Wagner | 359/125 |

OTHER PUBLICATIONS

G. Emory Anderson, "Centralized Wavelength Distribution for Dense WDM Systems" National Fiber Optic Engineers Conference, Technical Proceedings vol. II, Sep. 13, 1998.

Primary Examiner—James Davie
(74) Attorney, Agent, or Firm—Sawyer Law Group LLP

(57) ABSTRACT

The present invention provides a light source for an optical network. The light source includes a semiconductor optical gain element, having an axis of symmetry; and a mechanism for reflecting wavelengths that correspond to optical transmission channels of the optical network, the reflecting means optically coupled to the semiconductor optical gain element and intersecting the axis of symmetry. The light source of the present invention is a single multi-wavelength light source. It is designed to only emit wavelengths that specifically correspond to optical transmission channels. The mechanism of the light source suppresses possible mode hopping, thus maintaining the power stability of all channels. Since multiple wavelengths are provided in a single light source, the number of lasers required to service a network can be dramatically reduced, increasing efficiency and reducing the cost of equipment and time for maintenance as well.

38 Claims, 13 Drawing Sheets

MULTI-WAVELENGTH LASER LIGHT SOURCE

FIELD OF THE INVENTION

The present invention relates to fiber optic networks, and more particularly to light sources in a fiber optic network.

BACKGROUND OF THE INVENTION

Fiber optic networks are becoming increasingly popular for data transmission due to their high speed and high data capacity capabilities. In response to the demand for ever higher capacity fiber optic networks, network components are designed to provide increasingly broad bandwidths. As the number of wavelengths increases, so does the demand on the number of lasers required to maintain a laser source system in a network.

FIG. 1 illustrates one type of conventional laser source system. Assume that a fiber optic cable comprises ten parallel optical fibers, each associated with exactly one wavelength division multiplexer (WDM) system 102a–102j, respectively Each system comprises n wavelengths. Conventionally, one laser light source is used for each wavelength in a system. Thus, for n wavelengths in system 102a, n lasers 104.1–104.n are required; for the same n wavelengths in system 102b, n lasers 106.1–106.n are required; and for n wavelengths in system 102j, n lasers 108.1–108.n are required. For example, if each system comprises 64 wavelengths (that is, n=64), with ten systems, the fiber optic cable requires 640 lasers.

As the number of channels in data communications systems increases, the pass bands the wavelengths become narrower, placing more stringent requirements on the lasers' precision. Instability and imprecision can be caused by drift, mode hopping, and crosstalk, for example. Drift refers to the difference between an actual wavelength and the wavelength at the center of the pass band. If drift occurs, crosstalk between channels will be too large. Crosstalk occurs when one channel or part of a channel appears as noise on another adjacent channel. Mode hopping occurs when a laser randomly oscillates among permitted cavity modes of slightly different wavelengths. By using one laser per wavelength per system, each laser may be designed to provide a particular wavelength in a very stable manner with uniform intensity. However, lasers are expensive and must be selected for desired wavelength after manufacture and the requirement of one laser per wavelength per system burdens the network operator with high costs. Also, with so many lasers in different locations, maintenance and service of the lasers are expensive and time consuming.

One conventional way of decreasing this burden is illustrated in FIG. 2. FIG. 2 illustrates a centralized laser source transmission system. With this type of system, one high powered laser is used for each wavelength. The optical power from each laser is split among the systems in the cable. For example, assume the cable has ten parallel optical fibers each associated with exactly one WDM system 202a–202j respectively, and that each system comprises n wavelengths. For n wavelengths, n lasers 204.1–204.n are used, each emitting a single wavelength at ten times the power normally required. The power from laser 204a is split ten ways among the systems 202a–202j. The same is true for the wavelengths from lasers 204.2–204.n. Thus, for systems comprising 64 wavelengths each, instead of requiring 640 lasers as with the network illustrated in FIG. 1, the network in FIG. 2 only requires 64 lasers. Although this reduces the cost for lasers, there is a cost involved in providing high power at each wavelength. The maintenance and service of this number of single wavelength lasers is still costly and time consuming.

Accordingly, there exists a need for a multi-wavelength light source for a fiber optic network. The light source should not compromise the stability of the wavelengths. It should reduce the costs of operating and maintaining the network. The present invention addresses such a need.

SUMMARY OF THE INVENTION

The present invention provides a light source for an optical network. The light source includes a semiconductor optical gain element, having an axis of symmetry; and a mechanism for reflecting wavelengths that correspond to optical transmission channels of the optical network, the reflecting means optically coupled to the semiconductor optical gain element and intersecting the axis of symmetry. The light source of the present invention is a single multi-wavelength light source. It is designed to only emit wavelengths that specifically correspond to optical transmission channels. The mechanism of the light source suppresses possible mode hopping, thus maintaining the power stability of all channels. Since multiple wavelengths are provided in a single light source, the number of lasers required to service a network can be dramatically reduced, increasing efficiency and reducing the cost of equipment and time for maintenance as well.

DETAILED DESCRIPTION

The present invention provides a multi-wavelength light source for a fiber optic network. The present invention uses a polarization beam splitter and nonlinear interferometers to provide multiple wavelengths and stability in the emitted wavelengths. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

To more particularly describe the features of the present invention, please refer to FIGS. 3 through 11c in conjunction with the discussion below.

Figure 3:
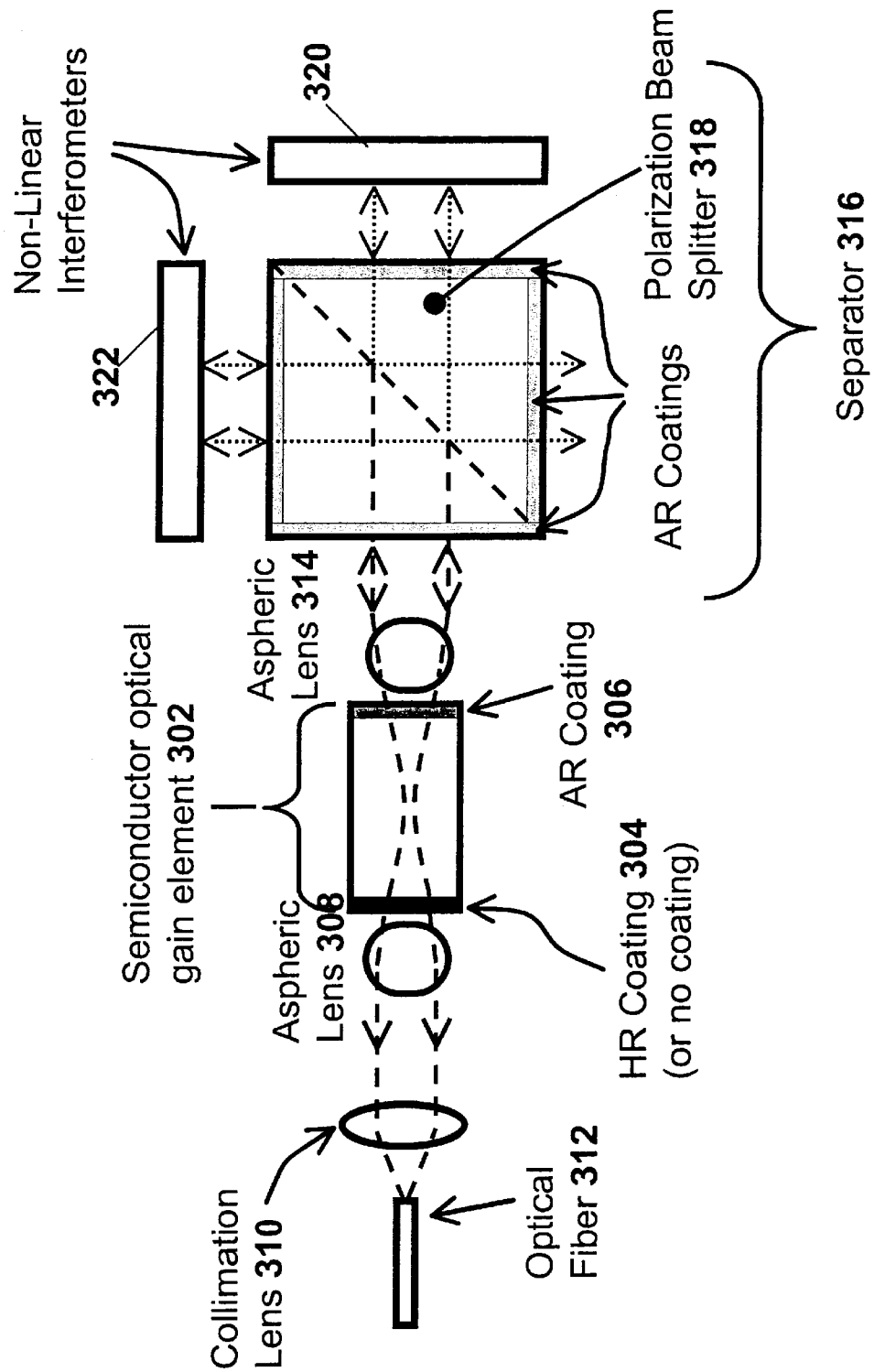
FIG. 3 is a top view of the preferred embodiment of the multi-wavelength laser light source in accordance with the present invention.

FIG. 3 illustrates a top view of a preferred embodiment of the multi-wavelength light source in accordance with the present invention. The multi-wavelength light source 300 provides luminous flux by using a semiconductor optical gain element 302 (SOGE). The SOGE 302 has a front facet 304 with either a high-reflectivity (HR) coating of a reflectivity, for example, greater than 30%, or no coating. It also has a rear facet 306 with an anti-reflection (AR) coating of a reflectivity, for example, of 1% or less. In this preferred embodiment, the SOGE 302 is a laser diode modified through application of an AR coating to the rear facet 306 of the semiconductor device such that light can both enter and exit through the rear facet 306. Disposed to the front of the front facet 304, in progression away from the front facet 304, are a front aspheric collimation lens 308, a focusing lens or lens assembly 310 and an output optical fiber 312.

Astigmatic laser light emanating from the front facet 304 of the SOGE 302 is collimated by the front aspheric lens 308. This collimated light is passed through the focusing lens or lens assembly 310 which focuses it onto an end face of the optical fiber 312. In this way, laser light emanating from the device 300 is received by the optical fiber 312. The fiber 312 may lead to, at its opposite end, a set of one or more optical modulators (not shown) for generating an optical signal or signals. Furthermore, the extended axis of the polarization maintaining optical fiber 312 comprises a main axis of the multi-wavelength light source 300. In other words, the axes, or centers of symmetry, of the SOGE 302, the front aspheric lens 308, the focusing lens 310 and the laser light beam are all coincident with this main axis defined by the axis of the optical fiber 312.

Disposed to the rear of the rear facet 306, in progression away from the rear facet 306, are a rear aspheric collimation lens 314 and a channel separator 316. The channel separator 316 comprises a polarization beam splitter 318 and a pair of non-linear interferometers 320 and 322. Although the polarization beam splitter 318 is illustrated as a "cube" beam splitter, one of ordinary skill in the art will understand that other types of polarization beam splitters may be employed in light source 300 without departing from the spirit and scope of the present invention. This channel separator 316 is based upon a separator disclosed in a co-pending U.S. Patent Application entitled "Fiber Optic Wavelength Division Multiplexer With a Phase Differential Method of Wavelength Separation Utilizing a Polarization Beam Splitter and a Nonlinear Interferometer", Ser. No. 09/129,635, filed on Aug. 6, 1998, U.S. Pat. No. 6,130,971. Applicant hereby incorporates this patent application by reference.

Figure 4:
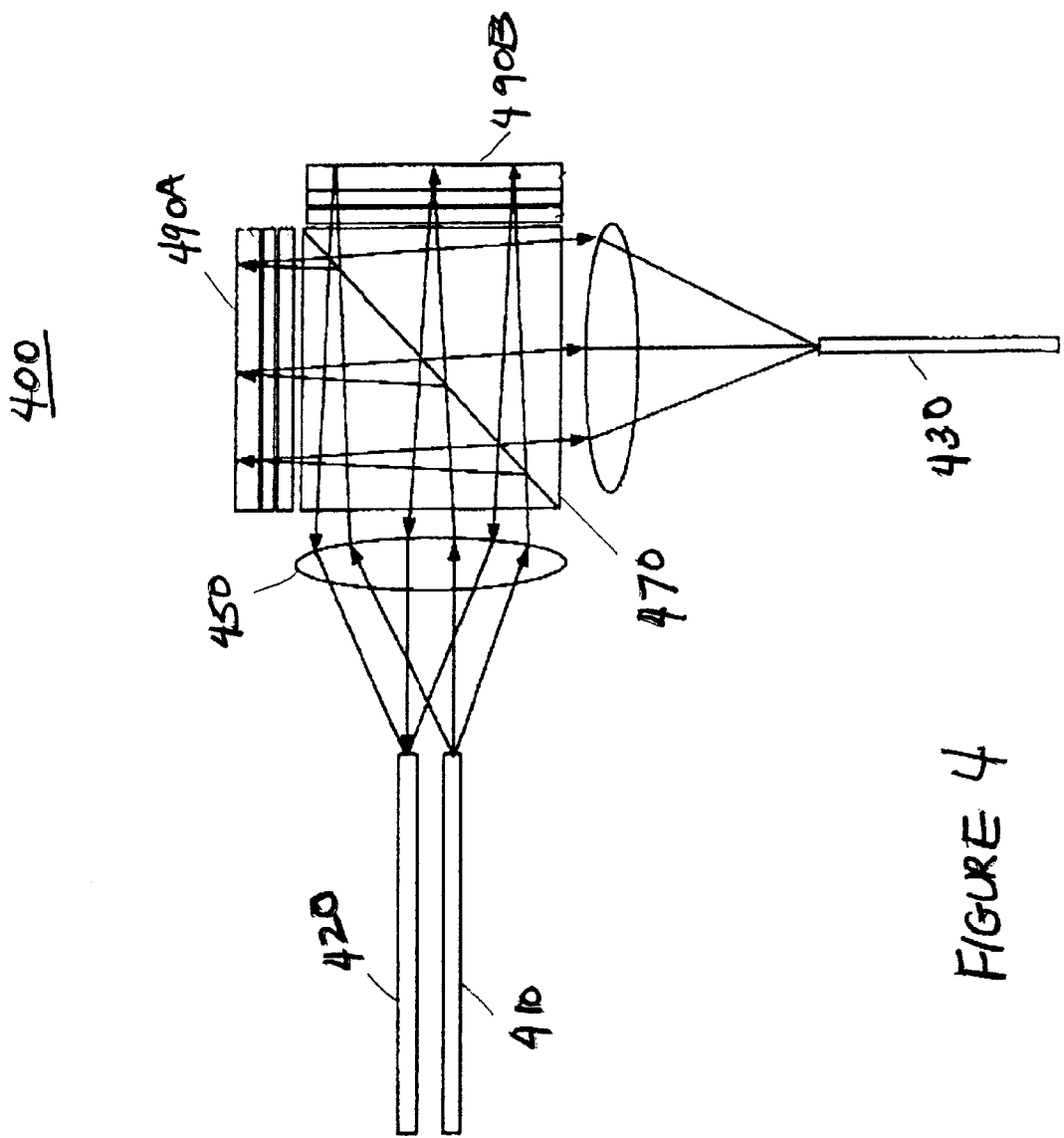
FIG. 4 illustrates a separator upon which the preferred embodiment of the separator in accordance with the present invention is based.

FIG. 4 illustrates a top view of a separator described in U.S. patent application Ser. No. 09/129,635, U.S. Pat. No. 6,130,971. The separator 400 comprises an optic fiber 410 for inputting an optical signal and optic fibers 420 and 430 for outputting optical signals. As the signal leaves the optic fiber 410, it diverges. A lens 450 collimates the signal and directs it toward a polarization beam splitter 470 which decomposes the signal based on its polarity. The portion of the signal polarized parallel to a plane in the splitter 470 is reflected toward an interferometer 490A. The portion of the signal polarized perpendicular to the plane in the splitter 470 passes through toward an interferometer 490B. The interferometers 490A and 490B introduce phase differences between the on-channel and off-channel wavelengths of the s polarization light and p polarization light respectively.

The non-linear interferometers 320 and 322 are disclosed in a co-pending U.S. Patent Applications entitled "Non-Linear Interferometer for Fiber Optic Wavelength Division Multiplexer Utilizing a Phase Differential Method of Wavelength Separation" Ser. No. 09/247,253, filed on Feb. 10, 1999, U.S. Pat. No. 6,169,604; and "Dense Wavelength Division Multiplexer Utilizing an Asymmetric Pass Band Interferometer", Ser. No. 09/388,350, filed on Sep. 1, 1999, U.S. Pat. No. 6,310,690. Applicant hereby incorporates these patent applications by reference.

Figure 5:
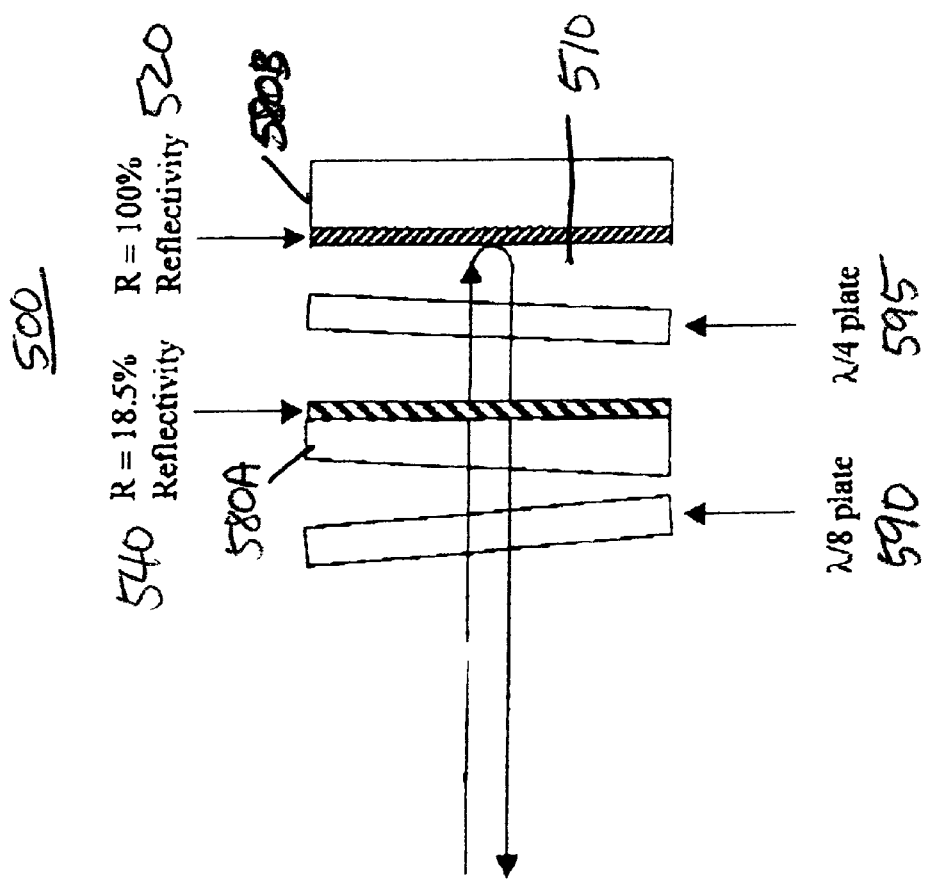
FIG. 5 illustrates a preferred embodiment of a nonlinear interferometer for the multi-wavelength light source in accordance with the present invention.

FIG. 5 illustrates an embodiment of a nonlinear interferometer as disclosed by the U.S. patent application Ser. No. 09/247,253, U.S. Pat. No. 6,169,604. The nonlinear interferometer 500 comprises two glass plates 580A–580B, creating a space 510 therebetween. The inside face of the glass plate 580B is coated with a reflective coating 520 with a reflectivity preferably of 100%. The inside face of the glass plate 580A is coated with a reflective coating 540 with variable reflectivity. A waveplate 595 is disposed within the space 510 between the two glass plates 580A and 580B. Also, a waveplate 590 is disposed external to the space 510 adjacent to the side of the first glass plate 580A opposite to the reflective coating 540. The waveplate 595 introduces, for a wavelength corresponding to at least one channel, an optical retardance $L_2$ comprising a variable phase change between an o-ray and an e-ray within the space 510. This phase change causes rotation of the polarization plane direction of light rays of these wavelengths as well as of the light rays of wavelengths corresponding to every second wavelength band. The waveplate 590 introduces an optical retardance of $L_1$ between an o-ray and an e-ray outside of the space 510. Furthermore, the reflective coatings 520 and 540 broaden the widths of the rotated and non-rotated wavelength bands and the waveplate 590 fine tunes the shapes of these bands.

Figure 11A:
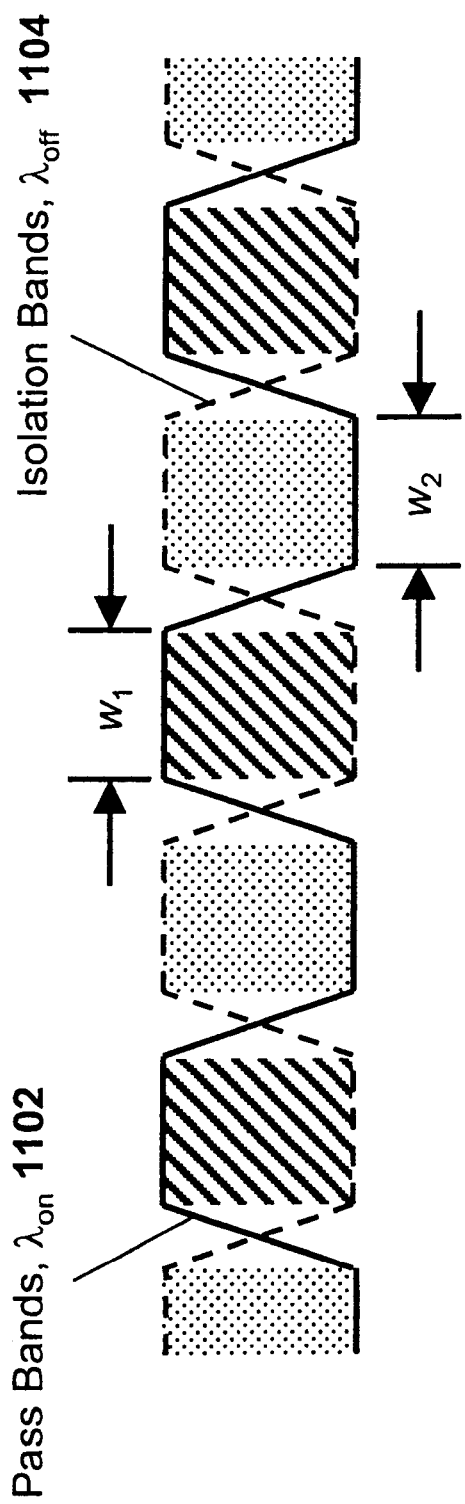
FIGS. 11a–11c illustrate various pass band configurations facilitated by the nonlinear interferometer of the multi-wavelength light source in accordance with the present invention.

FIG. 5 illustrates a particular embodiment of the nonlinear interferometer 500 in which $r_1$ is approximately equal to 18% reflectivity, and the waveplates 595 and 590 comprise retardance values of $L_2=\lambda/4$ and $L_1=\lambda/8$, respectively. In this embodiment, upon reflection from the nonlinear interferometer 500, the band 1102 comprising wavelengths of light whose polarization is not rotated comprise a band width $w_1$ and the bands 1104 comprising other wavelengths of light, whose polarization is rotated comprise a band width $w_2$, wherein $w_1=w_2$. The spectrum of these bands is schematically illustrated in FIG. 11a in which wavelength or frequency is plotted parallel to the base of the page.

Figure 11B:
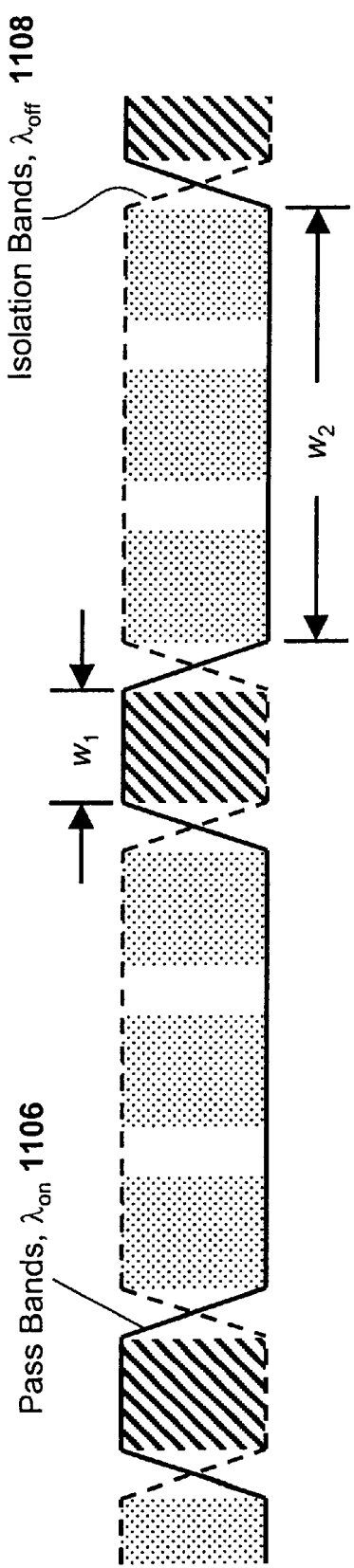

The values of $r_1$, $L_1$ and $L_2$ may also be independently varied so as to vary or control the effect of the nonlinear interferometer 500 upon signal light rays reflected therefrom. For instance, if $L_1=3\lambda/16$, $L_2=\lambda/8$ and $r_1=32.5\%$, then band width $w_1$ is only one third as wide as $w_2$, as shown in FIG. 11b. In other words, since, in FIG. 11b, the bands 1108 comprising wavelengths of light whose polarization is rotated alternate with bands 1106 comprising wavelengths of light whose polarization is not rotated, the band width $w_1$ is only one-fourth of the repeating period of the curve of bands 1106.

Figure 11C:
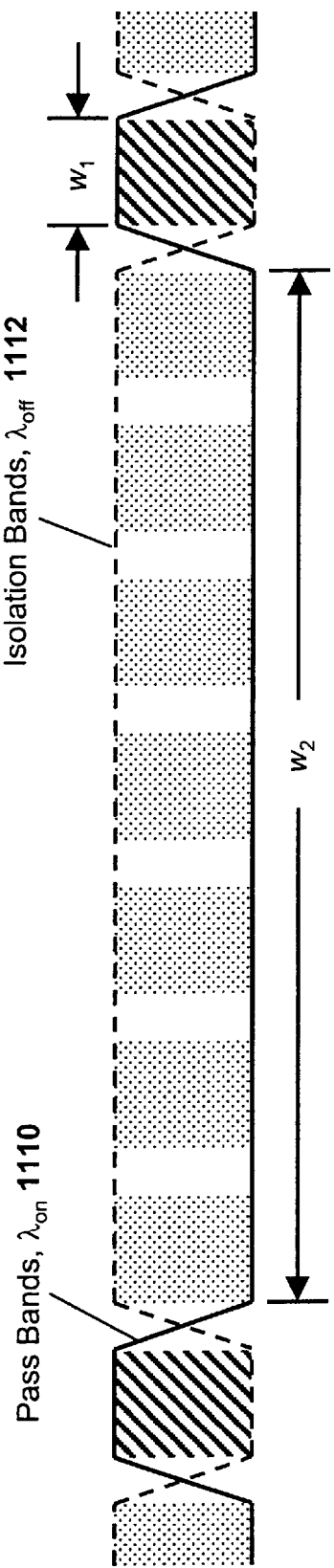

In another example, if the values of $L_1$, $L_2$ and $r_1$ are respectively set at $7\lambda/32$, $\lambda/16$ and 56.3%, then, as shown in FIG. 11c, the band widths $w_1$ of band 1110 and $w_2$ of band 1112 are related in the ratio of 1:7. In this latter case, the band width $w_1$ is only one-eighth of the period in the curve of bands 1110.

The separator 316 included in the light source 300 of the present invention is aligned such that the first non-linear interferometer 320 is adjacent to the face of the cube 318 that is centered upon and perpendicular to the main axis of the light source 300 on the side of beam splitter 318 opposite to lens 314 and also such that the other non-linear interferometer 322 is centered upon and perpendicular to a line passing through the center of the beam splitter 318 perpendicular to the main axis. That is, non-linear interferometer 320 and 322 are disposed so as to intercept the p-polarized and s-polarized light emanating from the polarization beam splitter 318, respectively, and reflect it back along the same path in the reverse direction. Applied to this separator 316 is an anti-reflection coating with reflectivity, for example of less than or equal to 1%, to at least four faces-the two cube faces that are adjacent to and across from each of the two non-linear interferometers 320 and 322.

The separator 316 of the light source 300 of the present invention behaves as a reflector that selectively reflects light originating in the SOGE 302 back into the SOGE 302. This separator 316 is at the rear side of the SOGE 302. The front facet 304 of the SOGE 302 behaves as a second reflector at the front of the SOGE 302. These two reflectors, together with the SOGE 302, comprise an external cavity laser. Lasing of this externalcavity laser can only occur at wavelengths at which each of the two bounding reflectors has adequate reflectivity. Furthermore, the separator 316, which comprises the rear reflector, is designed to only reflect wavelengths that correspond to optical transmission channels. Therefore, as discussed in greater detail below, laser emission occurs at the wavelengths of the channels.

The separator 316 functions as a selective wavelength reflection filter such that only wavelengths corresponding to every second band of wavelengths comprising the wavelengths $\lambda_{on}$ are fed back into the SOGE 302 so as to be amplified into laser emissions. The remaining wavelength bands, comprising the wavelengths $\lambda_{off}$ which alternate with the wavelengths $\lambda_{on}$, are eliminated. This function of the separator operation is now discussed with reference to FIGS. 6 and 7. In the following discussion, it is assumed that the band widths $w_1$ and $w_2$ of the $\lambda_{on}$ and $\lambda_{off}$ wavelengths are equal to one another as illustrated in FIG. 11a. If $\lambda_0$ is the center wavelength of one such band and $\Delta\lambda$ is the constant wavelength difference between successive $\lambda_{on}$ bands, then the wavelengths, $\lambda_{on}$, corresponding to the centers of all the various channel bands are approximately given by the expression $$\lambda_{on}=\lambda_0+n\Delta\lambda (n=\pm 1, \pm 2, \ldots)$$

Likewise, the set of wavelengths $\lambda_{off}$, corresponding to the centers of all the various isolation bands are approximately given by the expression $$\lambda_{off}=\lambda_0+[(2n+1)/2]\Delta\lambda \ (n=\pm 1, \pm 2, \ldots)$$

This selective wavelength reflection capability of the separator arises through the properties of the non-linear interferometers 320 and 322 included therein. Specifically, these interferometers 320 and 322 have the property that, upon reflection therefrom, the directions of the polarization planes of light of a specific set of wavelength bands are rotated by 90° whilst the polarization plane directions of other wavelength bands are maintained. The non-linear interferometers within the separator included in the present invention are designed such that the $\lambda_{off}$ wavelengths experience polarization plane rotation whilst the $\lambda_{on}$ wavelengths do not. As discussed further below and illustrated in FIGS. 6 and 7, this property causes the separator 316 to reflect light of the pass-band, $\lambda_{on}$, wavelengths, back into the semiconductor optical gain element while simultaneously directing light of the rejection-band, $\lambda_{off}$, wavelengths away from the semiconductor optical gain element.

Figure 6:
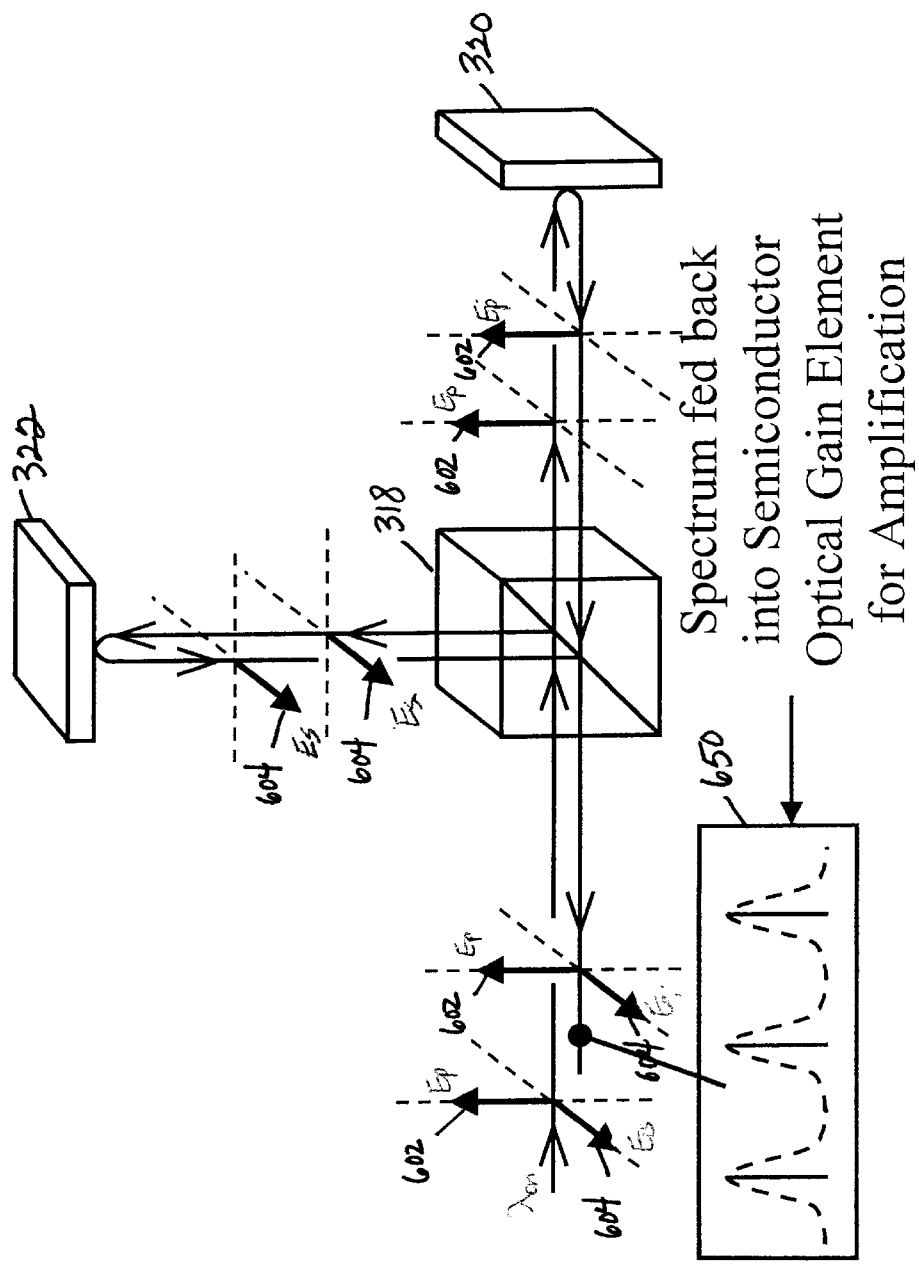
FIG. 6 is a view of the paths and polarization states of wavelengths, $\lambda_{on}$, corresponding to the centers of the light signal pass bands, during their traverse through the separator comprising a component of the present invention.

FIG. 6 illustrates the path of the pass-band, $\lambda_{on}$, wavelengths as they travel through the separator 316. These wavelengths are part of the luminous flux of the SOGE 302 that is directed to the separator 316 by the rear aspheric lens 314. An unpolarized light beam entering the polarization beam splitter 318 from the front is decomposed into two linearly polarized component light beams that comprise a p polarity component 602 ($E_p$) and an s polarity component 604 ($E_s$). The component $E_s$ 604 of the light of each wavelength, $\lambda_{on}$, travels to the second interferometer 322 while the complementary $E_p$ component 602 travels to the first interferometer 320. Both of these linearly polarized component beams 602 and 604 are reflected by the interferometers 320 and 322 respectively without a change in polarization plane orientation. After reflection, therefore, these light beams 602 and 604 re-trace their original paths back through the polarization beam splitter 318 and back through the rear aspheric lens 314 to the SOGE 302. Box 650 in FIG. 6 illustrates the spectrum fed back into the SOGE.

Figure 7:
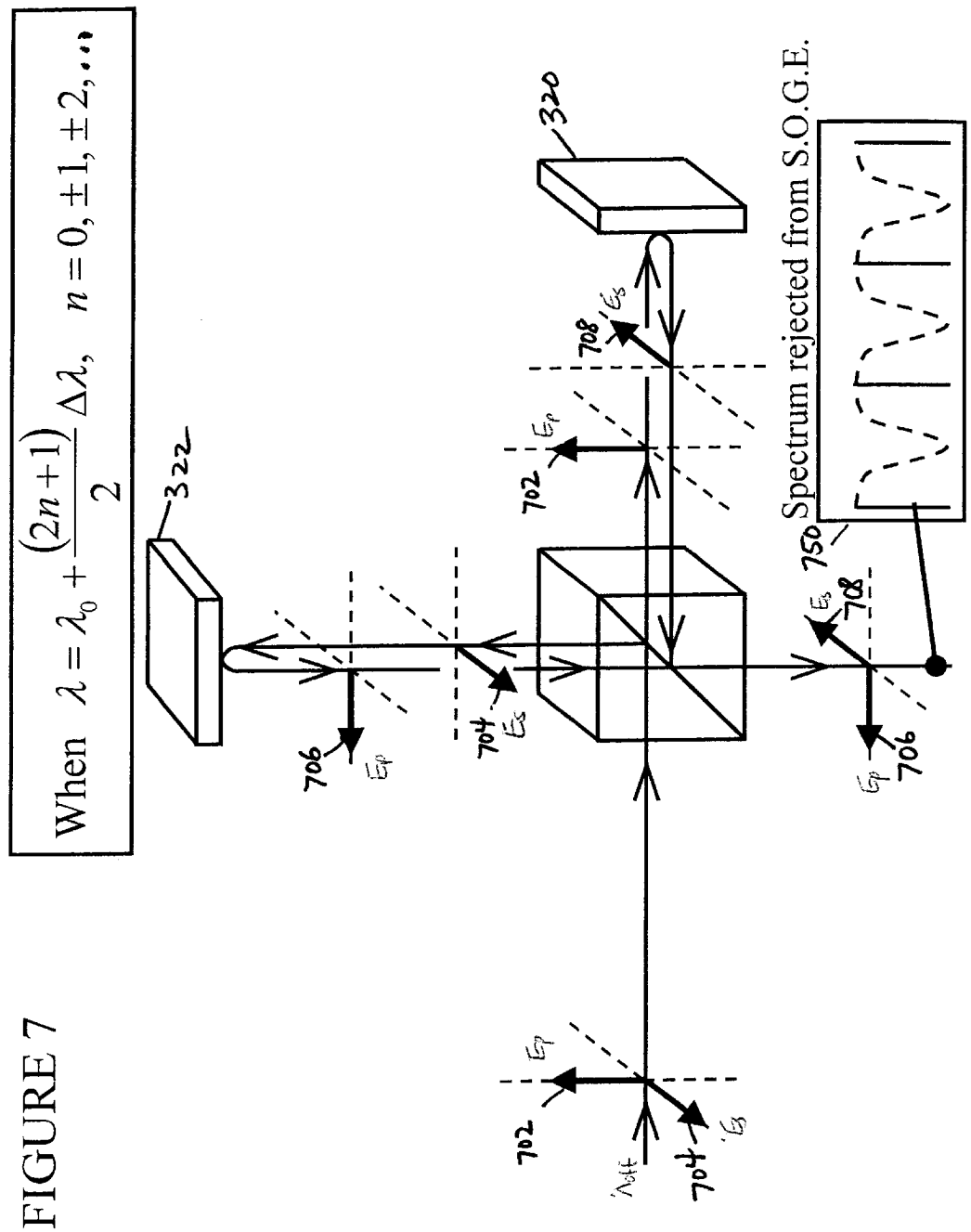
FIG. 7 is a view of the paths and polarization states of wavelengths, $\lambda_{off}$, corresponding to the centers of the isolation bands, during their traverse through the separator comprising a component of the present invention.

FIG. 7 illustrates the path of the isolation-band, $\lambda_{off}$, wavelengths as they travel through the separator 316. Light of each wavelength has a p polarity component 702 ($E_p$) and an s polarity component 704 ($E_s$). The component $E_s$ 704 of the light of each wavelength, $\lambda_{off}$, travels to the second interferometer 322 while the component $E_p$ 702 travels to first interferometer 320. For light of the $\lambda_{off}$ wavelengths, each of the two interferometers 320 and 322 causes a 90° rotation of the polarization plane during reflection. Because of this rotation, the $E_s$ component 704 is converted to an $E_p$ component 706, and the $E_p$ component 702 is converted to an $E_s$ component 708. When both of these rotated components 706 and 708 travel through the beam splitter 318 again, they therefore travel along paths that are different from their initial traverses through the beam splitter 318. The component 704 that was originally reflected by the beam splitter 318 during the first traverse is transmitted straight through the beam splitter 318 during its second traverse as component 706. The component 702 that was originally transmitted through the beam splitter 318 during its first traverse therethrough is reflected during its second traverse as component 708. Therefore, each output beam of wavelength $\lambda_{off}$ which is formed by the recombination of the two components 706 and 708 does not return to the SOGE 302. Box 750 in FIG. 7 illustrates the spectrum rejected from the SOGE 302.

Figure 8:
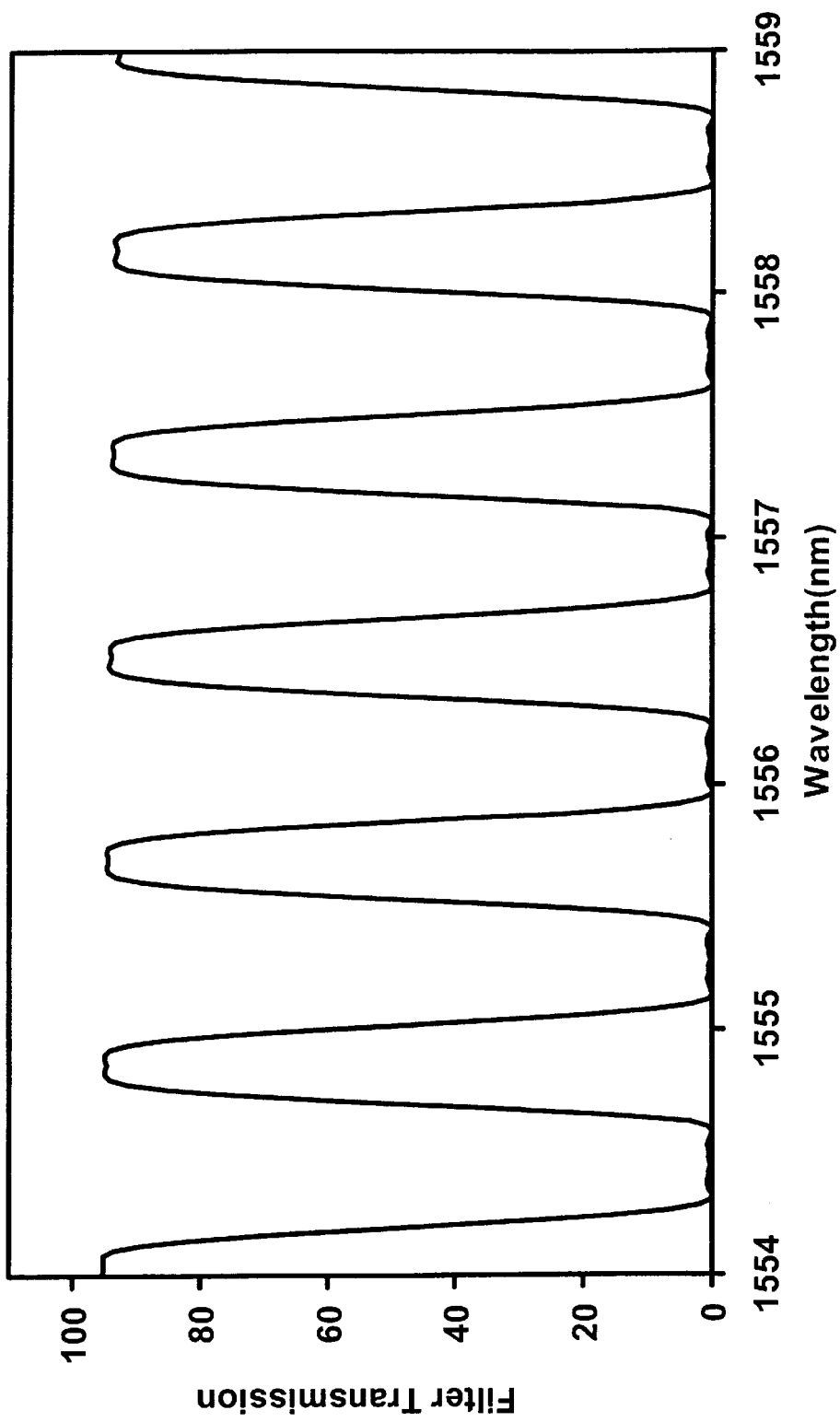
FIG. 8 is a graph of one possible permitted pass band vs. wavelength curve for the multi-wavelength laser light source of the present invention.

FIG. 8 is a graph of one possible permitted pass-band vs. wavelength curve for the multi-wavelength laser light source of the present invention. The invention is designed such that emission only occurs at wavelengths corresponding to the channels in a fiber-optic lightwave communications system. By controlling the properties of the non-linear interferometers 320 and 322 of the separator 316 within the current invention, the shape of this curve can be manipulated, as illustrated in FIGS. 11a–11c, so as to narrow the emissions at the pass bands and suppress the emissions at the isolation bands.

Figure 9:
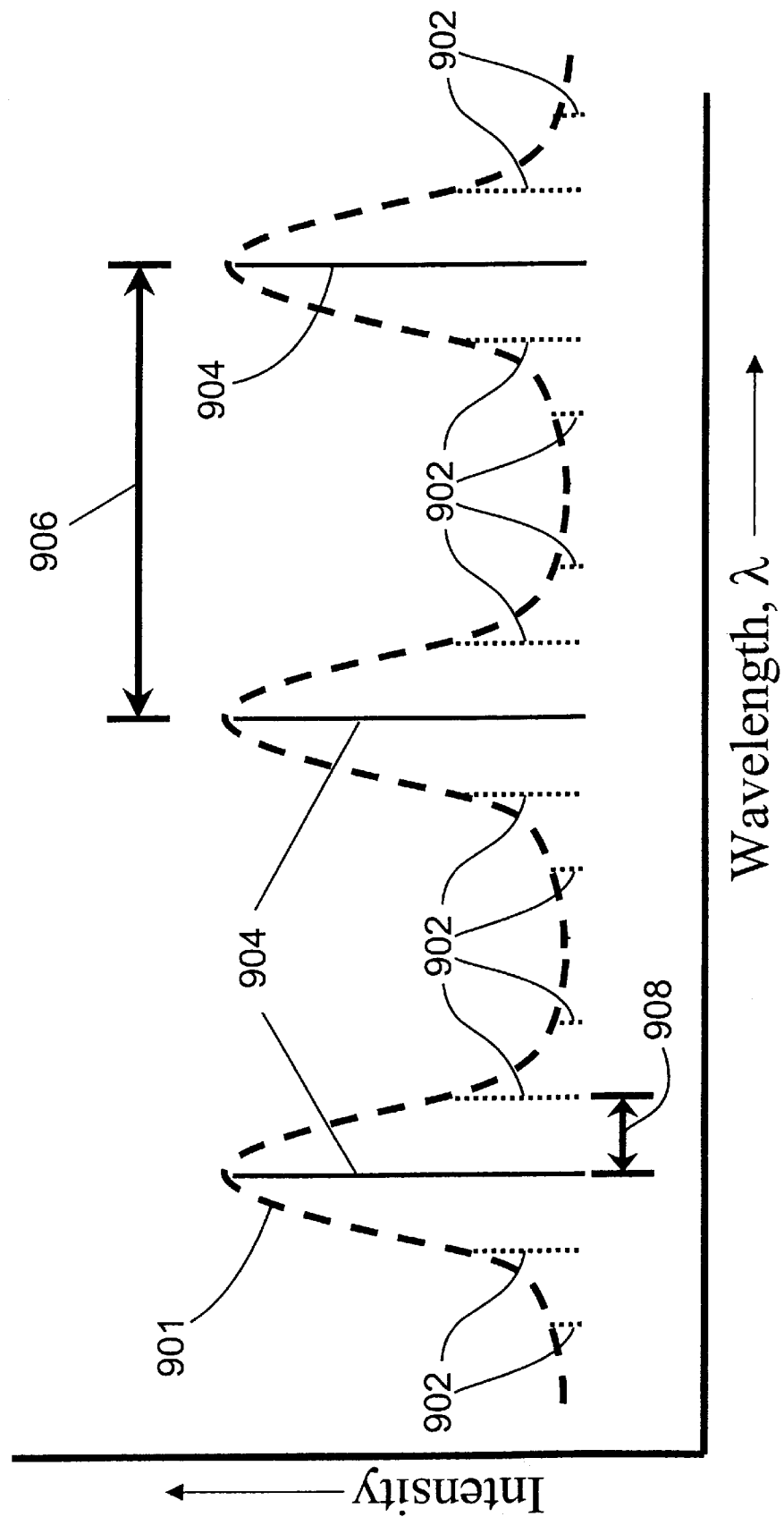
FIG. 9 is a schematic plot of the relationship of permitted pass bands to external cavity modes for the multi-wavelength laser light source of the present invention.

FIG. 9 is a schematic plot of the relationship of permitted pass bands to external cavity modes for the multi-wavelength laser light source of the present invention. The distance between the front facet 304 of the SOGE 302 and the rear mirror of either of the two non-linear interferometers 320 and 322 defines the external cavity length of the multi-wavelength laser 300 of the present invention. The two non-linear interferometers 320 and 322 are disposed relative to the SOGE 302, such that this cavity length is identical for both. For any external cavity laser of such an external cavity length, the set of all permissible laser emission wavelengths is given by the external cavity modes as shown by vertical dotted lines 902 in FIG. 9. However, in the laser 300 of the current invention, the permissible laser emissions are further restricted by the pass bands of the separator system as illustrated by heavy dashed curves 901 in FIG. 9. These pass bands are the set of wavelengths $\lambda_{on}$ which are reflected back into the SOGE 302 by the separator 316 and which are chosen so as to correspond to lightwave communications channels 904 in a fiber-optic system. The separator system thus fulfills the function of an optical comb filter permitting laser emission at only certain of the intercavity modes. The wavelength separation between the pass bands and between the channels 904 is shown as lasing mode spacing #1 906 in FIG. 9. This spacing, in terms of frequency, might typically be 100 GHz in a dense WDM system. Furthermore, the frequency separation, $\Delta\lambda$, between permitted external cavity modes—lasing mode spacing #2 908—is inversely proportional to the external cavity length through the relationship $\Delta\lambda=c/(2L)$, where c is the speed of light and L is the optical cavity length. As shown in FIG. 9, by keeping the optical cavity length small, at most one external cavity mode will overlap with any system pass band, thereby suppressing possible mode hopping and maintaining the power stability of all channels. For instance, if the optical cavity length L is 4 mm, then $\Delta\lambda=37.5$ GHz.

Figure 1:
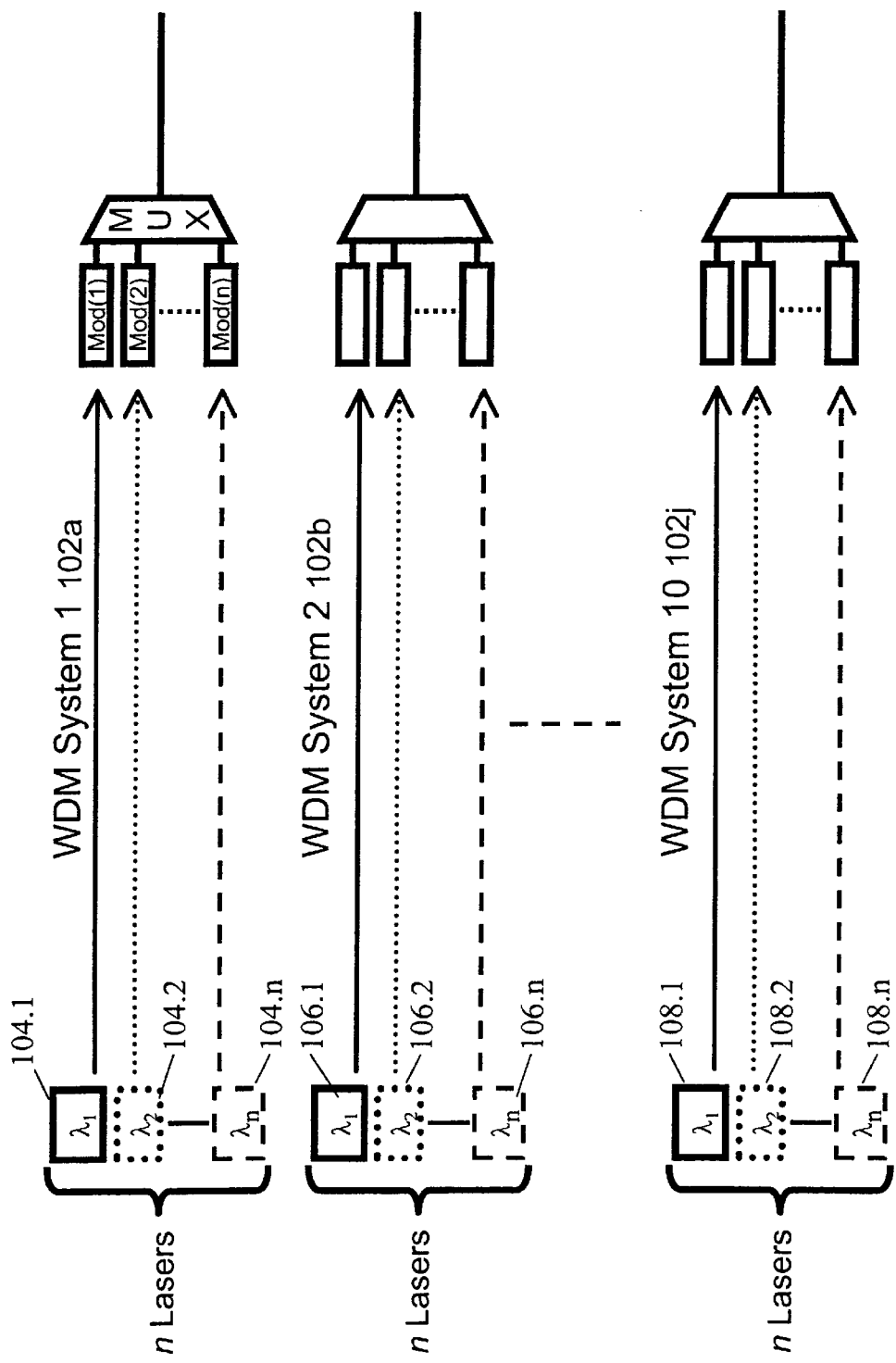
FIG. 1 illustrates a conventional laser source system for use in wavelength multiplexed fiber optic communications systems.
Figure 2:
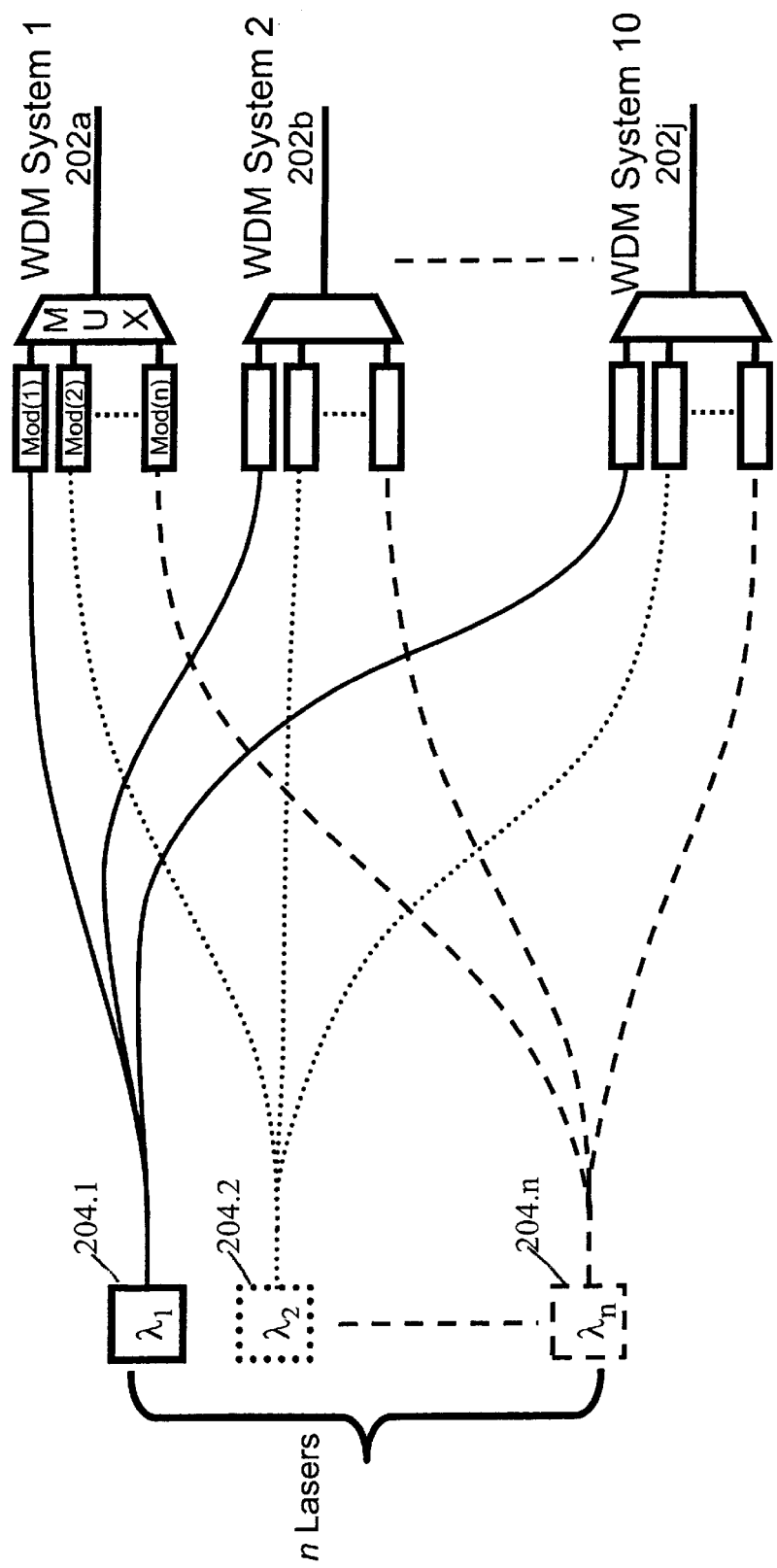
FIG. 2 illustrates another conventional laser source system for use in wavelength multiplexed fiber optic communications systems.

For the network illustrated in FIG. 1, a single multi-wavelength light source 300 of the present invention can replace the 10×n lasers 104a–108n and provide light to the systems 102a–102j. For the network illustrated in FIG. 2, the single multi-wavelength light source of the present invention can also replace the n lasers 204a–204n and provide light to all of the systems 202a–202j in the network. The present invention thus can reduce the required number of lasers from 640 to 1.

Figure 10:
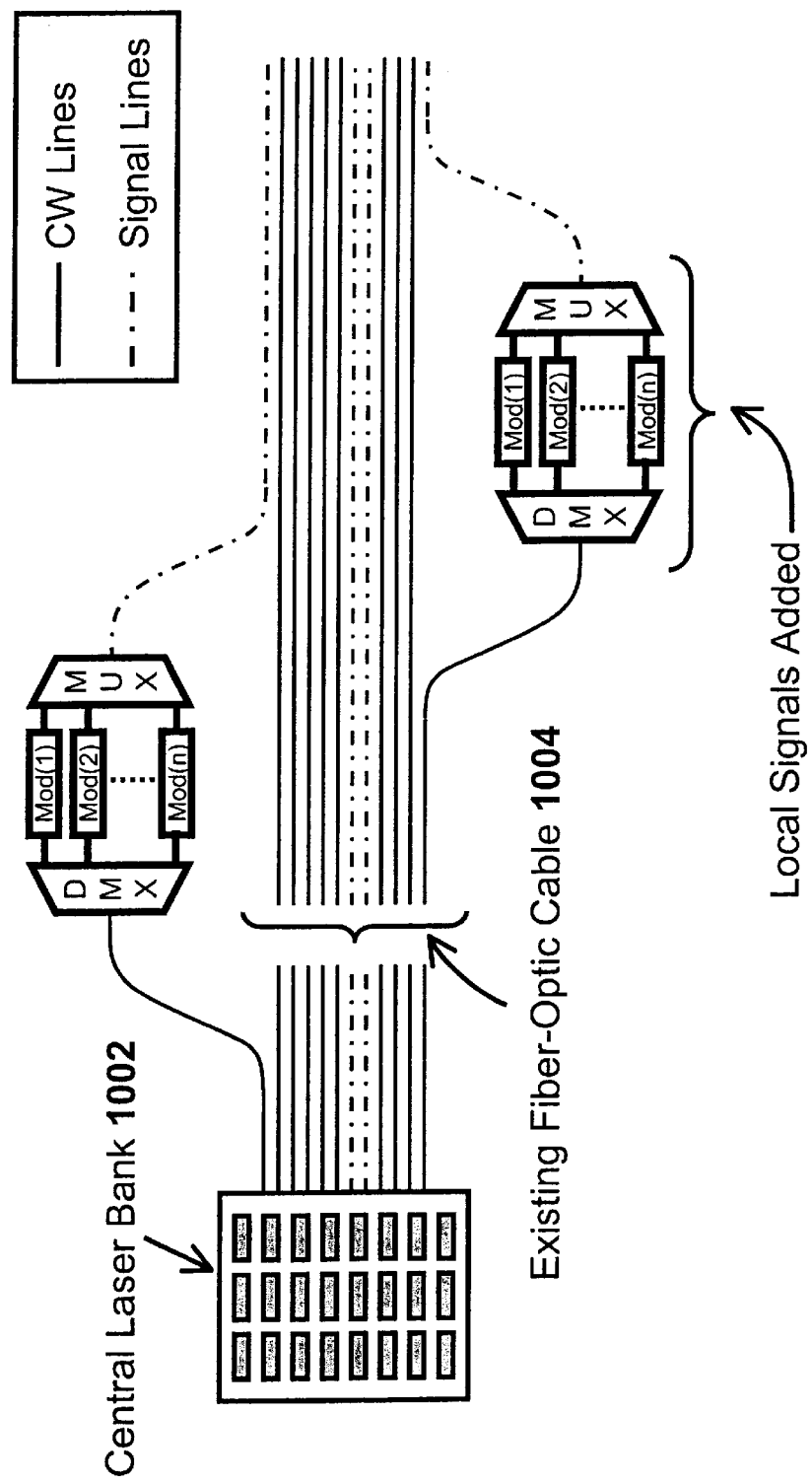
FIG. 10 illustrates the use of the multi-wavelength light source of the present invention in a central laser bank.

FIG. 10 illustrates the use of the multi-wavelength light source 300 of the present invention in a centralized light source distribution system. A plurality of the multiwavelength light sources 300 of the present invention would reside in a central laser bank 1002. A series of fiber optic cables 1004 carry either the modulated signal light or the unmodulated continuous wave (CW) light. The CW light is later modulated down stream at a peripheral office more conveniently located. Thus, the central laser bank 1002 of the multi-wavelength light sources of the present invention may function as the light source for many different offices, eliminating the need for these offices to have their own light source.

A multi-wavelength light source for a fiber optic network has been disclosed. The light source of the present invention is designed to only emit wavelengths that correspond to optical transmission channels. It suppresses possible mode hopping, thus maintaining the power stability of all channels. Since multiple wavelengths are provided in a single light source, the number of lasers required to service an optical network can be dramatically reduced, increasing efficiency and reducing the cost of equipment and time for maintenance as well.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A light source for an optical network, comprising:
   a semiconductor optical gain element having a main axis; and
   means for reflecting wavelengths that correspond to optical transmission channels of the optical network, the reflecting means optically coupled to the semiconductor optical gain element and intersecting the main axis, wherein the reflecting means comprises:
   a polarization beam splitter optically coupled to the semiconductor optical gain element, the polarization beam splitter intersecting the main axis, and
   two non-linear interferometers optically coupled to the polarization beam splitter.

2. The light source of claim 1, wherein the semiconductor optical gain element comprises:
   a front facet having a high-reflectivity coating or no coating; and
   a rear facet having an anti-reflectivity coating.

3. The light source of claim 1, further comprising:
   a first aspheric lens optically coupled to a rear facet of the semiconductor optical gain element and the reflecting means;
   a second aspheric lens optically coupled to a front facet of the semiconductor optical gain element;
   a focusing lens optically coupled to the second aspheric lens; and
   an output optical fiber optically coupled to the focusing lens.

4. The light source of claim 1, wherein the polarization beam splitter comprises anti-reflectivity coatings on faces adjacent to and across from each of the two non-linear interferometers.

5. The light source of claim 1, wherein the two non-linear interferometers comprise:
   a first of the non-linear interferometers optically coupled to a first side of the polarization beam splitter furthest from the semiconductor optical gain element, the first non-linear interferometer being perpendicular to the main axis; and
   a second of the non-linear interferometers optically coupled to a second side of the polarization beam splitter, the second non-linear interferometer being parallel to the main axis.

6. The light source of claim 1, wherein each of the non-linear interferometers comprises:
   a first glass plate optically coupled to a second glass plate, forming a space therebetween;
   means for introducing a polarization rotation in at least one channel of an optical signal; and means for broadening a bandwidth of a rotated band of the optical signal.

7. The light source of claim 6, wherein the broadening means comprises:
   (a) a first reflective coating residing inside the space and on the second glass plate;
   (b) a second reflective coating residing inside the space and on the first glass plate;
   (c) a phase bias element residing outside the space.

8. The light source of claim 7, wherein the first reflective coating (a) comprises a reflective coating with a reflectivity of approximately 100%.

9. The light source of claim 7, wherein the second reflective coating (b) comprises a reflective coating with a reflectivity of approximately 18%.

10. The light source of claim 7, wherein the phase bias element (c) is a $\lambda/8$ waveplate.

11. The light source of claim 6, wherein the introducing means comprises a phase bias element residing inside the space.

12. The light source of claim 11, wherein the phase bias element is a 8/4 waveplate.

13. The light source of claim 6, wherein the introducing means comprises:
   a reflective coating residing inside the space and on the first glass plate;
   a first waveplate with a first optical retardance residing inside the space; and
   a second waveplate with a second optical retardance, optically coupled to the first glass plate and residing outside the space, wherein a combination of values for the first reflectivity, the first optical retardance, and the second optical retardance effects a separation of channels in at least one optical signal into at least two sets, wherein the at least two sets have asymmetrically interleaved pass bands.

14. A light source for an optical network, comprising:
   an output optical fiber;
   a semiconductor optical gain element optically coupled to the output optical fiber, creating a main axis, the semiconductor optical gain element comprising a front facet and a rear facet;
   a polarization beam splitter optically coupled to the rear facet of the semiconductor optical gain element and intersecting the main axis; and
   two non-linear interferometers optically coupled to the polarization beam splitter,
      a first of the non-linear interferometers optically coupled to a first side of the polarization beam splitter furthest from semiconductor optical gain element, the first non-linear interferometer being perpendicular to and intersecting the main axis, and
      a second of the non-linear interferometers optically coupled to a second side of the polarization beam splitter perpendicular to the first face, the second non-linear interferometer being parallel to the main axis.

15. The light source of claim 14, wherein the front facet comprises a high-reflectivity coating or no coating.

16. The light source of claim 14, wherein the rear facet comprises an anti-reflectivity coating.

17. The light source of claim 14, further comprising:
   a first aspheric lens optically coupled to the rear facet and the polarization beam splitter;
   a second aspheric lens optically coupled to the front facet;
   a focusing lens optically coupled to the second aspheric lens; and
   an optical fiber optically coupled to the focusing lens.

18. The light source of claim 14, wherein the polarization beam splitter comprises anti-reflectivity coatings on faces adjacent to and across from each of the two non-linear interferometers.

19. The light source of claim 14, wherein each of the non-linear interferometers comprises:
   a first glass plate optically coupled to a second glass plate, forming a space therebetween;
   means for introducing a polarization rotation in at least one channel of an optical signal; and
   means for broadening a bandwidth of a rotated band of the optical signal.

20. The light source of claim 19, wherein the broadening means comprises:
   (a) a first reflective coating residing inside the space and on the second glass plate;
   (b) a second reflective coating residing inside the space and on the first glass plate; and
   (c) a phase bias element residing outside the space.

21. The light source of claim 20, wherein the first reflective coating (a) comprises a reflective coating with a reflectivity of approximately 100%.

22. The light source of claim 20, wherein the second reflective coating (b) comprises a reflective coating with a reflectivity of approximately 18%.

23. The light source of claim 20, wherein the phase bias element (c) is a $\lambda/8$ waveplate.

24. The light source of claim 19, wherein the introducing means comprises a phase bias element residing inside the space.

25. The light source of claim 24, wherein the phase bias element is a 8/4 waveplate.

26. The light source of claim 19, wherein the introducing means comprises:
   a reflective coating residing inside the space and on the first glass plate;
   a first waveplate with a first optical retardance residing inside the space; and
   a second waveplate with a second optical retardance, optically coupled to the first glass plate and residing outside the space, wherein a combination of values for the first reflectivity, the first optical retardance, and the second optical retardance effects a separation of channels in at least one optical signal into at least two sets, wherein the at least two sets have asymmetrically interleaved pass bands.

27. A light source for an optical network, comprising:
   an output optical fiber;
   a semiconductor optical gain element optically coupled to the output optical fiber, creating a main axis, the semiconductor optical gain element comprising a front facet and a rear facet;
   a polarization beam splitter optically coupled to the rear facet of the semiconductor optical gain element and intersecting the main axis;
   two non-linear interferometers optically coupled to the polarization beam splitter,
      a first of the non-linear interferometers optically coupled to a first side of the polarization beam splitter furthest from the semiconductor optical gain element, the first non-linear interferometer being perpendicular to and intersecting the main axis, and a second of the non-linear interferometers optically coupled to a second side of the polarization beam splitter, the second non-linear interferometer being parallel to the main axis;

a first aspheric lens optically coupled to the rear facet and the polarization cube beam splitter;

a second aspheric lens optically coupled to the front facet;

a focusing lens optically coupled to the second aspheric lens; and an optical fiber optically coupled to the focusing lens.

28. The light source of claim 27, wherein the front facet comprises a high-reflectivity coating or no coating.

29. The light source of claim 27, wherein the rear facet comprises an anti-reflectivity coating.

30. The light source of claim 27, wherein the polarization beam splitter comprises anti-reflectivity coatings on faces adjacent to and across from each of the two non-linear interferometers.

31. The light source of claim 27, wherein each of the non-linear interferometers comprises:

a first glass plate optically coupled to a second glass plate, forming a space therebetween;

means for introducing a polarization rotation in at least one channel of an optical signal; and means for broadening a bandwidth of a rotated band of the optical signal.

32. The light source of claim 31, wherein the broadening means comprises:

(a) a first reflective coating residing inside the space and on the second glass plate;

(b) a second reflective coating residing inside the space and on the first glass plate; and (c) a phase bias element residing outside the space.

33. The light source of claim 32, wherein the first reflective coating (a) comprises a reflective coating with a reflectivity of approximately 100%.

34. The light source of claim 32, wherein the second reflective coating (b) comprises a reflective coating with a reflectivity of approximately 18%.

35. The light source of claim 32, therein the phase bias element (c) is a $\lambda/8$ waveplate.

36. The light source of claim 32, wherein the introducing means comprises a phase bias element residing inside the space.

37. The light source of claim 36, wherein the phase bias element is a 8/4 waveplate.

38. The light source of claim 31, wherein the introducing means comprises:

a reflective coating residing inside the space and on the first glass plate;

a first waveplate with a first optical retardance residing inside the space; and a second waveplate with a second optical retardance, optically coupled to the first glass plate and residing outside the space, wherein a combination of values for the first reflectivity, the first optical retardance, and the second optical retardance effects a separation of channels in at least one optical signal into at least two sets, wherein the at least two sets have asymmetrically interleaved pass bands.

* * * * *